US006933756B2

(12) United States Patent
Miyazawa

(10) Patent No.: US 6,933,756 B2
(45) Date of Patent: Aug. 23, 2005

(54) ELECTRONIC CIRCUIT, METHOD OF DRIVING ELECTRONIC CIRCUIT, ELECTRONIC DEVICE, ELECTRO-OPTICAL DEVICE, METHOD OF DRIVING ELECTRO-OPTICAL DEVICE, AND ELECTRONIC APPARATUS

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/670,346

(22) Filed: Sep. 26, 2003

(65) Prior Publication Data

US 2004/0095168 A1 May 20, 2004

(30) Foreign Application Priority Data

Oct. 3, 2002 (JP) .................................... 2002-291145
Sep. 8, 2003 (JP) .................................... 2003-315583

(51) Int. Cl.[7] .............................................. H03K 3/00

(52) U.S. Cl. ......................... 327/112; 345/80; 345/82; 345/204; 315/169.3; 315/169.4

(58) Field of Search ............................ 345/80, 82, 83, 345/205, 206; 315/169.3, 169.4; 327/108, 110, 112

(56) References Cited

U.S. PATENT DOCUMENTS 5,903,246 A 5/1999 Dingwall .................... 345/82
5,952,789 A 9/1999 Stewart et al. ........... 315/169.4
6,091,203 A 7/2000 Kawashima et al. ..... 315/169.3
6,229,506 B1 5/2001 Dawson et al. ............... 345/82
6,229,508 B1 5/2001 Kane ............................ 345/82
6,501,466 B1 12/2002 Yamagishi et al. ......... 345/204
6,734,636 B2 * 5/2004 Sanford et al. .......... 315/169.3
6,750,833 B2 * 6/2004 Kasai .......................... 345/76
2003/0209989 A1 * 11/2003 Anzai et al. ............. 315/169.3
2004/0041525 A1 * 3/2004 Park et al. ............... 315/169.3
2004/0056605 A1 * 3/2004 Yoshida .................. 315/169.3

FOREIGN PATENT DOCUMENTS

JP A-2001-147659 5/2001

* cited by examiner

*Primary Examiner*—Tuan T. Lam
(74) *Attorney, Agent, or Firm*—Oliff & Berridge, PLC

(57) ABSTRACT

Pixel circuit include a driving transistor, a first switching transistor, a second switching transistor, a storage capacitor, and an organic EL element, respectively. Each control circuit, which is connected to second electrode of the organic EL element through an electric potential control line and sets the electric potential of the second electrode to a driving voltage or a cathode voltage, is provided between first and second voltage supply lines and the pixel circuits in the rightmost column direction of the pixel circuits arranged on a display panel in a matrix.

21 Claims, 5 Drawing Sheets

ELECTRONIC CIRCUIT, METHOD OF DRIVING ELECTRONIC CIRCUIT, ELECTRONIC DEVICE, ELECTRO-OPTICAL DEVICE, METHOD OF DRIVING ELECTRO-OPTICAL DEVICE, AND ELECTRONIC APPARATUS

BACKGROUND OF THE INVENTION

1. Field of Invention

The present invention relates to an electronic circuit, a method of driving an electronic circuit, an electronic device, an electro-optical device, a method of driving an electro-optical device, and an electronic apparatus.

2. Description of Related Art

It is recently expected that an electro-optical device with low power consumption, a high viewing angle, and a high contrast ratio can be realized, because an organic EL devices have a spontaneous emission element that can be driven with low power consumption.

For example, one method of driving an electro-optical device that includes a liquid crystal element, an organic EL element, an electrophoresis element, and a field emission display (FED) is an active matrix driving method. An electro-optical device using an active matrix driving method includes a display panel with a plurality of pixel circuits arranged in a matrix. Each of the pixel circuits includes an electro-optical element and a driving transistor for supplying driving power to the electro-optical element.

According to the driving transistor, because of the variation of characteristics of each pixel circuit, such as threshold voltage, the brightness of the electro-optical device may vary in each pixel, even if data signals corresponding to the same gray scale are supplied.

In particular, when a thin film transistor is used as the driving transistor, the variation of the threshold voltage is significant. Therefore, a transistor for reducing the variation of the characteristics of the driving transistor is disposed in the pixel circuit see Japanese Unexamined Patent Application Publication No. 2001-147659.

When a transistor for reducing the variation of the characteristics of the driving transistor is provided in each pixel circuit, the aperture ratio of the pixel circuit is reduced with the reduction in yield. For example, in the case of an organic EL element, when the aperture ratio is reduced, it is necessary to supply as much current as the reduction in the aperture ratio, thereby increasing power consumption and reducing the life of the organic EL element.

SUMMARY OF THE INVENTION

Accordingly, the present invention provides an electronic circuit, a method to drive the electronic circuit, an electronic device, an electro-optical device, a method to drive the electro-optical device, and an electronic apparatus which are capable of reducing the variation of the threshold voltage while reducing the number of transistors used.

An electronic circuit of an aspect of the present invention includes a plurality of unit circuits. Each of the plurality of unit circuits includes a first transistor including a first terminal, a second terminal, and a first control terminal; a second transistor including a third terminal and a fourth terminal, the third terminal being connected to the first terminal; an electronic element including a fifth terminal and a sixth terminal, the fifth terminal being connected to the first terminal; and a third transistor to control electrical connection between the first terminal and the first control terminal, the sixth terminal being set to a plurality of electric potentials or being electrically connected to a predetermined electric potential and being electrically disconnected from the predetermined electric potential.

Therefore, it is possible to reduce the number of transistors constituting a unit circuit as compared with the related art.

An electronic circuit of an aspect of the present invention includes a plurality of unit circuits. Each of the plurality of unit circuits includes a first transistor including a first terminal, a second terminal, and a first control terminal; a second transistor including a third terminal and a fourth terminal, the third terminal being connected to the first terminal; an electronic element including a fifth terminal and a sixth terminal, the fifth terminal being connected to the first terminal; and a third transistor to control electrical connection between the first terminal and the first control terminal, the sixth terminal including a control circuit connected to an electric potential control line, the control circuit setting the electric potential control line to a plurality of electric potentials or controlling electrical connection and electrical disconnection between the electric potential control line and a predetermined electric potential.

Therefore, it is possible to reduce the number of transistors constituting a unit circuit as compared with the related art.

According to this electronic circuit, transistors included in each of the unit circuits being only the first transistor, the second transistor, and the third transistor.

Therefore, it is possible to reduce the number of transistors constituting a unit circuit by one as compared with the related art.

According to this electronic circuit, a capacitive element is connected to the first control terminal.

Therefore, it is possible to control the level of current that flows through an electronic element in accordance with the quantity of charge accumulated in a capacitive element.

According to this electronic circuit, the control circuit is a fourth transistor including a ninth terminal and a tenth terminal, the ninth terminal being connected to the sixth terminal through the electric potential control line, and the tenth terminal being connected to a supply line to supply the plurality of electric potentials or the predetermined electric potential.

Therefore, it is possible to easily form the control circuit.

According to this electronic circuit, the electronic element may be a current-driven element.

Therefore, it is possible to reduce the number of transistors constituting a unit circuit that includes a current-driven element.

An electronic circuit of an aspect of the present invention includes an electronic element; a first transistor including a first terminal, a second terminal, and a control terminal and controlling a current level supplied to the electronic element in accordance with an electric conduction state, the first terminal being connected to one end of the electronic element; a second transistor connected to the first transistor; and a control circuit connected to another end of the electronic element, the control circuit controlling current not to flow through the electronic element in a period where current flows through a first current path including the first transistor and the second transistor and to control current to flow through a second current path including the first transistor and the electronic element in a state where the second transistor is in an off state.

Therefore, it is possible to reduce the number of transistors constituting a unit circuit.

The electronic circuit further includes a capacitive element connected to the control terminal and holding a quantity of charge corresponding to a current level of the current flowing through the first current path.

Therefore, it is possible to reduce the number of transistors constituting a unit circuit.

An aspect of the present invention provides a method of driving an electronic circuit including an electronic element; a first transistor including a first terminal, a second terminal, and a control terminal, the first terminal being connected to one end of the electronic element; a capacitive element connected to the control terminal; and a second transistor connected to the first terminal. The method includes the steps of: setting the electric potential of another end of the electronic element to an electric potential reducing or preventing current from flowing through the electronic element, supplying current to a first current path including at least the first transistor and the second transistor, and accumulating a quantity of charge corresponding to a current level of the current passing through the first current path in the capacitive element; and setting the electric potential of another end of the electronic element to an electric potential letting current flow through the electronic element and supplying current with a current level corresponding to the quantity of charge to the electronic element.

Therefore, it is possible to drive an electronic circuit in which the number of transistors constituting a unit circuit is reduced.

An electronic device of an aspect of the present invention includes a plurality of first signal lines, a plurality of second lines, and a plurality of unit circuits, each of the plurality of unit circuits including: an electronic element including a first electrode and a second electrode and driven in accordance with a current level of the current flowing between the first electrode and the second electrode; a first transistor connected to the first electrode and controlling the current level in accordance with an electric conduction state; a second transistor connected to the first transistor and electrically connecting one of the plurality of second signal lines to the first transistor by switching to an on state in accordance with a control signal supplied from one of the plurality of first signal lines; and a capacitive element to hold a quantity of charge corresponding to current signals supplied from the first signal line and determining an electric conduction state of the first transistor, the electric potential of the second electrode being set such that current does not flow through the electronic element, or the second electrode is electrically disconnected from a power source potential in a period where at least the second transistor is in an on state.

Therefore, it is possible to provide an electronic device including a plurality of unit circuits, in which the number of transistors is reduced as compared with the related art.

An electro-optical device of an aspect of the present invention includes a plurality of scanning lines, a plurality of data lines, a plurality of unit circuits, and a plurality of power source lines, each of the plurality of unit circuits includes: a first transistor including a first terminal, a second terminal, and a first control terminal, the second terminal being connected to one of the plurality of power source lines; a second transistor including a third terminal, a fourth terminal, and a second control terminal, the third terminal being connected to the first terminal, the fourth terminal being connected to one of the plurality of data lines, and the second control terminal being connected to one of the plurality of scanning lines; an electro-optical element including a fifth terminal and a sixth terminal, the fifth terminal being connected to the first terminal; a capacitive element including a seventh terminal and an eighth terminal, the seventh terminal being connected to the first control terminal; a third transistor to control electrical connection between the first terminal and the first control terminal; an electric potential control line connected to the sixth terminal together with the sixth terminals of the other unit circuits of the plurality of unit circuits; and a control circuit to set the electric potential control line to a plurality of electric potentials or to control electrical connection and electrical disconnection between the electric potential control line and a predetermined electric potential.

Therefore, it is possible to provide an electro-optical device including a plurality of unit circuits, in which the number of transistors is reduced as compared with the related art. In this way, it is possible to enhance the aperture ratio of the pixel circuit, thereby reducing the power consumption of the electro-optical device and reducing the current supplied to the electro-optical device. As a result, it is possible to lengthen the life of the electro-optical device.

According to this electro-optical device, preferably, only the first transistor, the second transistor, and the third transistor are transistors included in each of the unit circuits.

Therefore, it is possible to provide an electro-optical device including a plurality of unit circuits, in which the number of transistors is reduced by one as compared with the related art.

According to this electro-optical device, the control circuit is a fourth transistor including a ninth terminal and a tenth terminal, wherein the ninth terminal is connected to the sixth terminal through the electric potential control line, and the tenth terminal is connected to a supply line to supply the plurality of electric potentials or the predetermined electric potential.

Therefore, it is possible to easily form the control circuit.

According to this electro-optical device, the electro-optical element is an EL element in which a light-emitting layer is made of an organic material.

Therefore, it is possible to reduce the number of transistors in a unit circuit including an organic EL element and constituting an electro-optical device.

According to this electro-optical device, electro-optical elements of the same color are arranged along one of the plurality of scanning lines.

Therefore, it is possible to provide an electro-optical device capable of displaying full colors, in which the number of transistors is reduced as compared with the related art.

An aspect of the present invention provides a method of driving an electro-optical device including a plurality of data lines, a plurality of scanning lines, and a plurality of unit circuits, each of the plurality of unit circuits including: an electro-optical element exhibiting an optical effect in accordance with an electric potential difference between a first electrode and a second electrode; a first transistor including a first terminal, a second terminal, and a first control terminal, the first terminal being connected to the first electrode; a capacitive element connected to the first control terminal; and a second transistor including a third terminal, a fourth terminal, and a second control terminal, the third terminal being connected to the first terminal, the fourth terminal being connected to one of the plurality of data lines, and the second control terminal being connected to one of the plurality of scanning lines, the method including: a first step of setting an electric potential of the second electrode such that the electro-optical element does not exhibit an optical effect and further switching the second transistor to an on state by supplying scanning signals to the second control terminal through one of the plurality of scanning lines, supplying data signals as current from the one data line to the first transistor through the second transistor, and accumulating a quantity of charge corresponding to the data signals in the capacitive element; and a second step of switching the second transistor to an off state by supplying scanning signals to the second control terminal through the scanning line and further setting an electric potential of the second electrode such that the electro-optical element exhibits an optical effect, and supplying a voltage of the voltage level or a current of the current level in accordance with an electric conduction state of the first transistor set in accordance with the quantity of charge accumulated in the capacitive element to the electro-optical element through the first electrode.

Therefore, it is possible to drive an electro-optical device in which the number of transistors constituting a unit circuit is reduced.

According to the method of driving the electro-optical device, each of the plurality of unit circuits further includes a third transistor to control electrical connection and electrical disconnection between the first terminal and the first control terminal, the first terminal being electrically connected to the first control terminal by switching the third transistor to an on state at least in a part of the period where the first step is performed, and the first terminal being electrically disconnected from the first control terminal by switching the third transistor to an off state at least in a part of the period where the second step is performed.

Therefore, it is possible to store the quantity of charge corresponding to data signals in a capacitive element in the first step and to supply the current corresponding to the quantity of charge accumulated in the capacitive element to an electro-optical device in the second step.

According to the method of driving the electro-optical device, the electro-optical element may be an organic EL element.

In this way, according to an electro-optical device including a unit circuit in which the number of transistors is reduced as compared with the related art, it is possible to drive the electro-optical device, in which the organic EL element is used as the electro-optical element provided in the unit circuit.

An electronic apparatus according to an aspect of the present invention is mounted with the above-mentioned electronic circuit.

Therefore, according to an electronic circuit including a unit circuit that supplies current corresponding to a data signal supplied from the outside to an electronic element, it is possible to provide an electronic apparatus including an electronic circuit in which the number of transistors constituting the unit circuit is reduced by one as compared with the related art.

An electronic apparatus according to an aspect of the present invention is equipped with the above-mentioned electro-optical device.

Therefore, according to the electro-optical device including a unit circuit that supplies current corresponding to a data signal supplied from the outside to an electronic element, it is possible to provide an electronic apparatus including the electro-optical device in which the number of transistors constituting the unit circuit is reduced by one as compared with the related art. In this way, it is possible to reduce the area of the electronic circuit occupied by the transistor and thus to realize an electro-optical device with high aperture ratio. As a result, it is possible to reduce the power consumption of the electronic apparatus and to enhance the yield of the electronic apparatus.

DETAILED DESCRIPTION OF PREFERRED EMBODIMENTS

First Exemplary Embodiment

Figure 1:
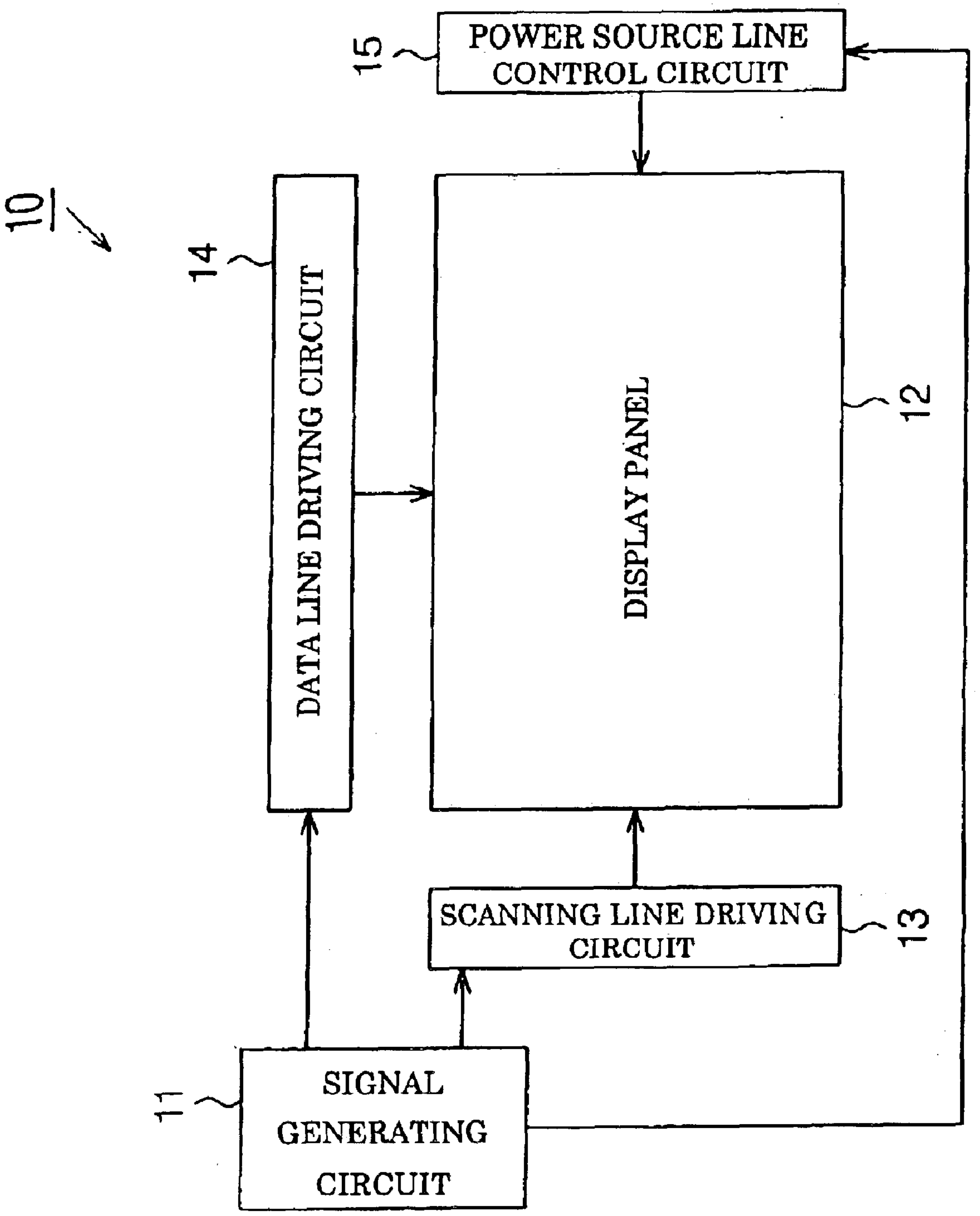
FIG. 1 is a circuitry block schematic illustrating a circuit structure of an organic EL display according to an exemplary embodiment of the present invention.
Figure 2:
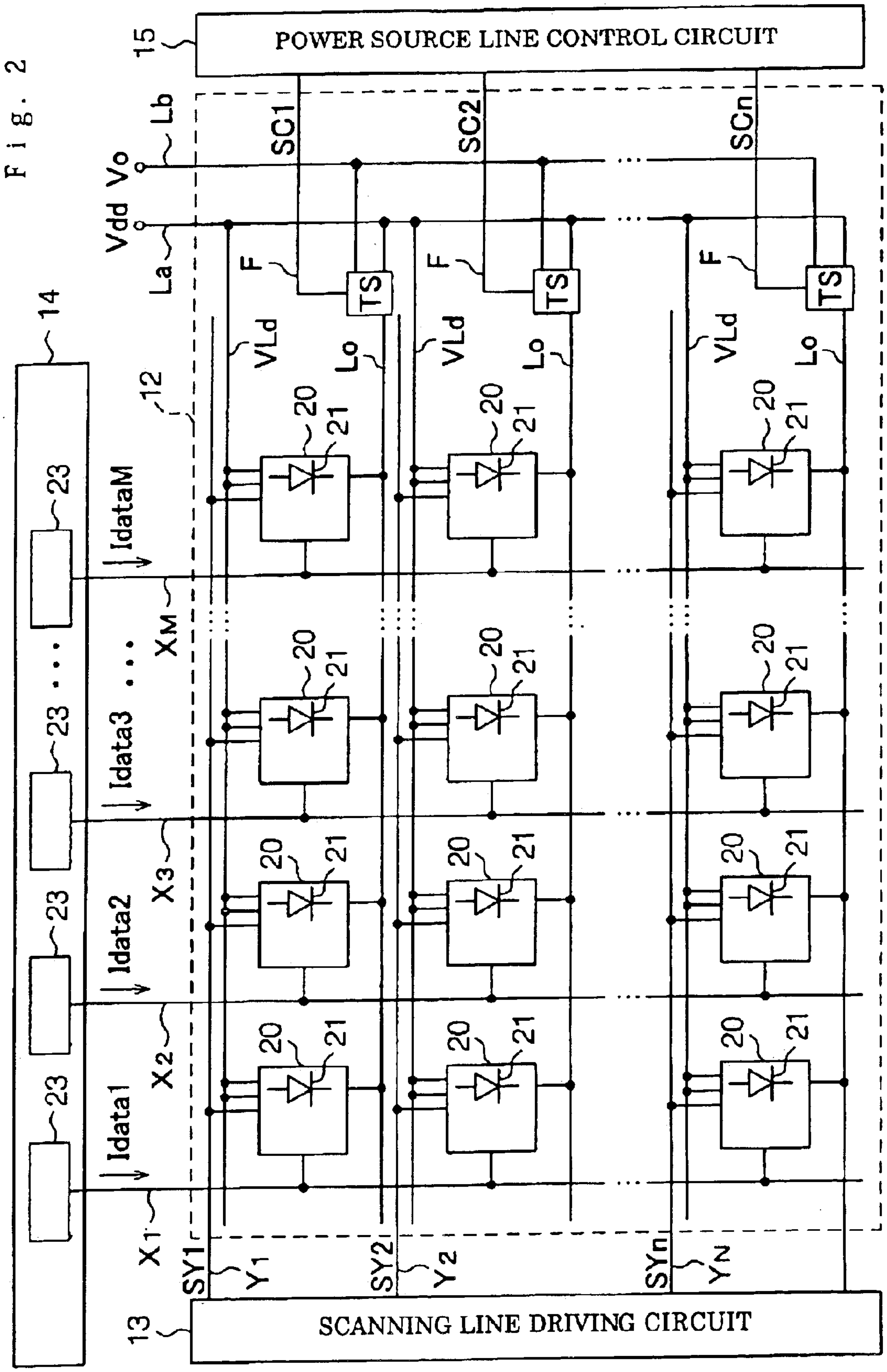
FIG. 2 is a circuitry block schematic illustrating internal structures of a display panel and a data line driving circuit according to a first exemplary embodiment of the present invention.
Figure 3:
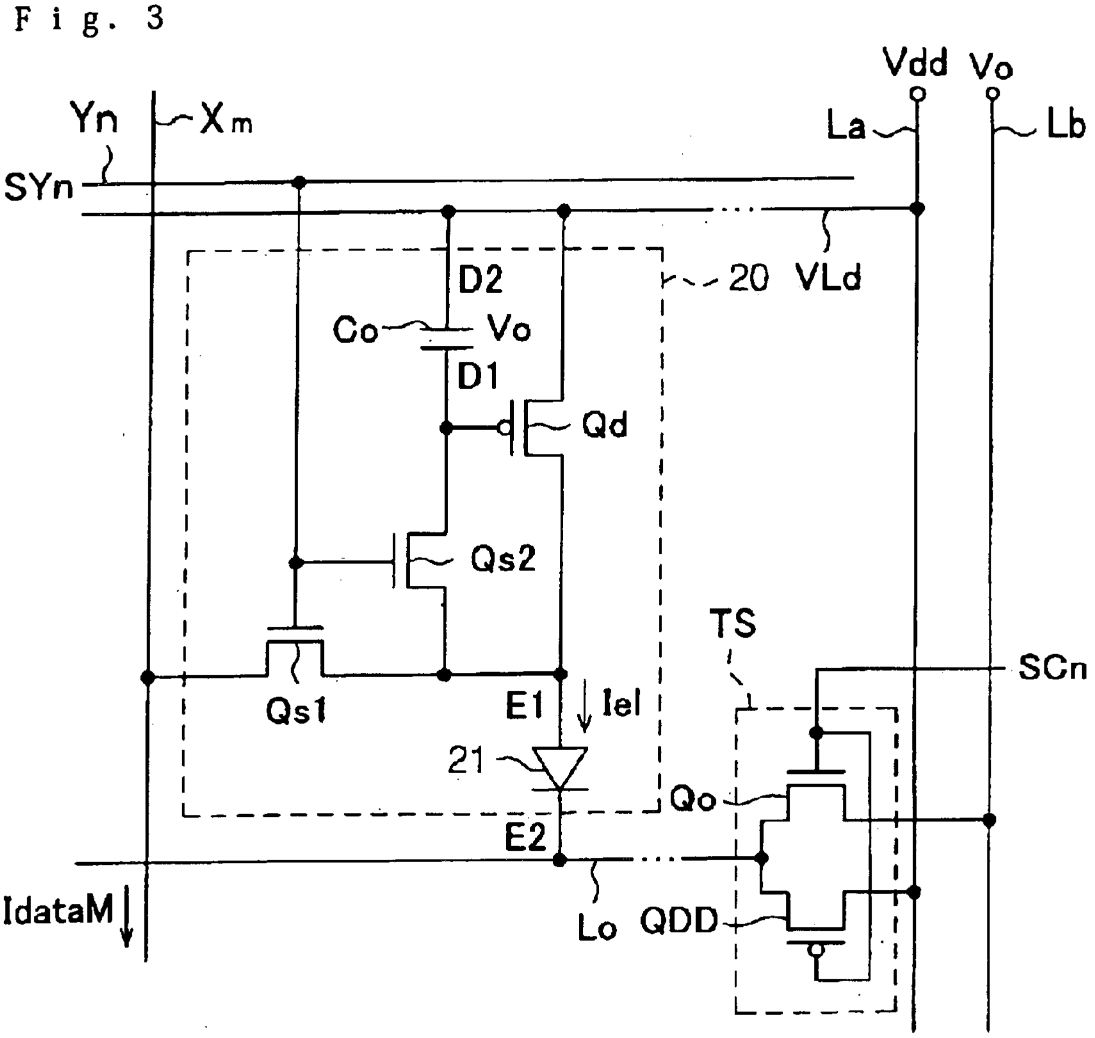
FIG. 3 is a circuit schematic of a pixel circuit according to the first exemplary embodiment of the present invention.
Figure 4:
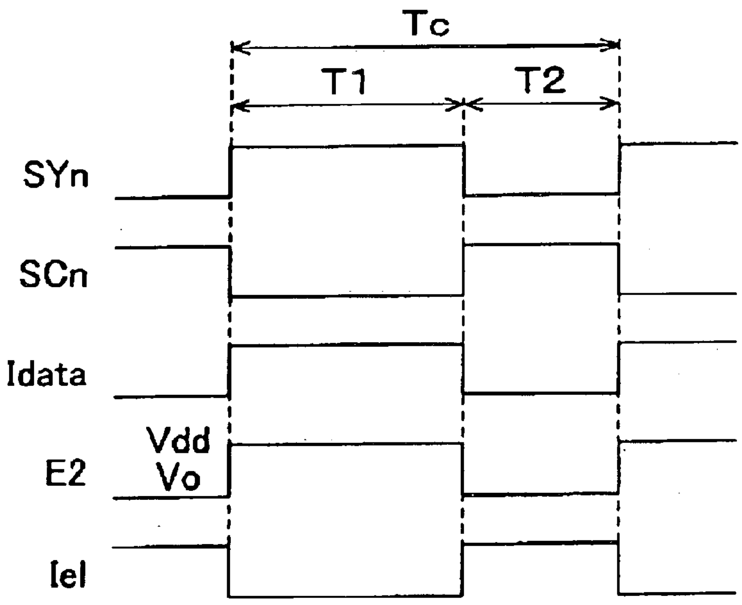
FIG. 4 is a timing chart illustrating a method of driving the pixel circuit according to the first exemplary embodiment of the present invention.

A first exemplary embodiment of the present invention will now be described with reference to FIGS. 1 to 4. FIG. 1 is a circuitry block schematic illustrating a circuit structure of an organic EL display as an electro-optical device. FIG. 2 is a circuitry block schematic illustrating internal structures of a display panel and a data line driving circuit as electronic circuits. FIG. 3 is a circuit schematic of a pixel circuit. FIG. 4 is a timing chart for describing a method of driving the pixel circuit.

An organic EL display 10 includes a signal generating circuit 11, a display panel 12, a scanning line driving circuit 13, a data line driving circuit 14, and a power source line control circuit 15. Each of the signal generating circuit 11, the scanning line driving circuit 13, the data line driving circuit 14, and the power source line control circuit 15 of the organic EL display 10 may be formed of an independent electronic component. For example, each of the signal generating circuit 11, the scanning line driving circuit 13, the data line driving circuit 14, and the power source line control circuit 15 may be composed of one chip semiconductor integrated circuit device. In addition, all or a part of the signal generating circuit 11, the scanning line driving circuit 13, the data line driving circuit 14, and the power source line control circuit 15 may be formed of a programmable IC chip, and the function thereof may be executed by software written in the IC chip.

The signal generating circuit 11 generates scanning control signals and data control signals to display images on the display panel 12 based on image data from an external device (not shown). Furthermore, the signal generating circuit 11 outputs the scanning control signals to the scanning line driving circuit 13 and outputs the data control signals to the data line driving circuit 14. Moreover, the signal generating circuit 11 outputs timing control signals to the power source line control circuit 15.

As illustrated in FIG. 2, the display panel 12 includes pixel circuits 20 as a plurality of unit circuits, which are arranged at positions corresponding to the intersection portions of M data lines Xm (m=1 to M, where m is an integer) extending in a column direction and N scanning lines Yn (n=1 to N, where n is an integer) extending in a row direction. That is, the pixel circuits 20 are connected between the data lines Xm extending in the column direction and the scanning lines Yn extending in the row direction and then arranged in a matrix. The pixel circuits 20 are connected to power source lines VLd and electric potential lines Lo extending in parallel to the scanning lines Yn.

The power source lines VLd are connected to a first voltage supply line La extending along the column direction of the pixel circuits 20 arranged at the right end of the display panel 12. The first voltage supply line La is connected to a power source (not shown) to supply a driving voltage Vdd. Therefore, the driving voltage Vdd is supplied to the respective pixel circuits 20 through the first voltage supply line La and the power source lines VLd.

The electric potential control lines Lo are connected to control circuits TS. The control circuits TS are connected to a second voltage supply line Lb extending along the column direction of the pixel circuits 20 arranged at the right end of the display panel 12. The second voltage supply line Lb is connected to the power source (not shown) to supply a cathode voltage Vo. Furthermore, The control circuits TS are connected to the power source line control circuit 15 which supplies power source line control signals SCn (which is mentioned later) to control the control circuits TS through power source line control lines F. The driving voltage Vdd is previously set to be larger than the cathode voltage Vo.

As illustrated in FIG. 2, the pixel circuits 20 include organic EL elements 21 in which light-emitting layers are formed of an organic material. Transistors (which are mentioned later) arranged in the pixel circuits 20 are generally formed of TFTs (thin film transistors).

The scanning line driving circuit 13 selects one scanning line of N scanning lines Yn arranged in the display panel 12 based on the scanning control signals output from the signal generating circuit 11 and outputs scanning signals SY1, SY2, . . . , and SYn to the selected scanning line.

The data line driving circuit 14 includes a plurality of single line drivers 23 as illustrated in FIG. 2. The single line drivers 23 are connected to the corresponding data lines Xm arranged in the display panel 12. The data line driving circuit 14 generates data currents Idata1, Idata2, . . . , and IdataM based on the data control signals output from the signal generating circuit 11. The data line driving circuit 14 outputs the generated data currents Idata1, Idata2, . . . , and IdataM to the pixel circuits 20 through the data lines Xm. When the internal states of the pixel circuits 20 are set in accordance with the data currents Idata1, Idata2, . . . , and IdataM, the pixel circuits 20 control driving current Ie1 supplied to the organic EL elements 21 in accordance with the current levels of the data currents Idata1, Idata2, . . . , and IdataM.

The power source line control circuit 15 is connected to the control circuits TS through the power source line control lines F, as mentioned above. The power source line control circuit 15 generates the power source line control signals SCn to determine an electrical connection state (an on state) or an electrical disconnection state (an off state) between the electric potential control lines Lo and the first voltage supply line La based on the timing control signals output from the signal generating circuit 11. Furthermore, the power source line control circuit 15 generates the power source line control signals SCn to determine the electrical connection state (the on state) or the electrical disconnection state (the off state) between the electric potential control lines Lo and the second voltage supply line Lb based on the timing control signals output from the signal generating circuit 11.

To be specific, the power source line control signals SCn electrically disconnect the second voltage supply line Lb from the electric potential control lines Lo (the off state) when the electric potential control lines Lo are electrically connected to the first voltage supply line La (the on state) and electrically connect the electric potential control lines Lo to the second voltage supply line Lb (the on state) when the electric potential control lines Lo are electrically disconnected from the first voltage supply line La (the off state).

The control circuits TS supply the driving voltage Vdd or the cathode voltage Vo to the pixel circuits 20 through the electric potential control lines Lo in response to the power source line control signals SCn.

The pixel circuits 20 of the organic EL display 10, constituted as described above, will now be described with reference to FIG. 3. For the convenience of description, the pixel circuits 20 arranged between the scanning lines Yn and the data lines Xm will now be described.

As illustrated in FIG. 3, the pixel circuit 20 includes three transistors, a capacitive element, and an organic EL element 21. To be specific, the pixel circuit 20 includes a driving transistor Qd, a first switching transistor Qs1, a second switching transistor Qs2, and a storage capacitor Co. The conductive type of the driving transistor Qd is a p type (a p channel). The conductive types of the first and second switching transistors Qs1 and Qs2 are an n type (as n channel).

A source of the driving transistor Qd is connected to the power source line VLd. A drain of the driving transistor Qd is connected to a source of the first switching transistor Qs2 and a first electrode E1 of the organic EL element 21.

Furthermore, the second switching transistor Qs2 is connected between a gate of the driving transistor Qd and the drain of the driving transistor Qd. A first electrode D1 of the storage capacitor Co is connected to the gate of the driving transistor Qd. A second electrode D2 of the storage capacitor Co is connected to the power source line VLd.

A drain of the first switching transistor Qs1 is connected to the data line Xm. A gate of the first switching transistor Qs1 is connected to a gate of the second switching transistor Qs2 and the scanning line Yn. A second electrode E2 of the organic EL element 21 is connected to the electric potential line Lo.

The control circuit TS is connected to the electric potential control line Lo connected to the pixel circuit 20 with the above structure. The control circuit TS is arranged between the first and second voltage supply lines La and Lb and the pixel circuit 20 arranged along the rightmost column direction of the pixel circuits 20 arranged in the display panel 12 in a matrix.

The control circuit TS includes a cathode voltage transistor Qo and a driving voltage transistor QDD. The conductive type of the cathode voltage transistor Qo is an n type (an n channel). The conductive type of the driving voltage transistor QDD is a p type (a p channel).

A source of the cathode voltage transistor Qo is connected to a drain of the driving voltage transistor QDD and the electric potential control line Lo. A drain of the cathode voltage transistor Qo is connected to the second voltage supply line Lb to supply the cathode voltage Vo. A source of the driving voltage transistor QDD is connected to the first voltage supply line La to supply the driving voltage Vdd. A gate of the cathode voltage transistor Qo and a gate of the driving voltage transistor QDD are connected to each other and are connected to the power source line control line F. Furthermore, the power source line control signals SCn generated by the power source line control circuit 15 are supplied to the gate of the cathode voltage transistor Qo and the gate of the driving voltage transistor QDD.

That is, the control circuits TS are shared by the pixel circuits 20 arranged in the display panel 12 in the row direction.

According to the present exemplary embodiment, a first transistor, a second transistor, and a third transistor described in the claims correspond to, for example, the driving transistor Qd, the first switching transistor Qs1, and the second switching transistor Qs2, respectively. According to the present exemplary embodiment, a first terminal and a second terminal described in the claims correspond to, for example, the drain of the driving transistor Qd and the source of the driving transistor Qd, respectively. Furthermore, according to the present exemplary embodiment, a first control terminal or a control terminal of the first transistor described in the claims corresponds to, for example, the gate of the driving transistor Qd.

According to the present exemplary embodiment, a third terminal, a fourth terminal, and a second control terminal described in the claims correspond to, for example, the drain of the first switching transistor Qs1, the source of the first switching transistor Qs1, and the gate of the first switching transistor Qs1, respectively. Furthermore, according to the present exemplary embodiment, a fifth terminal and a sixth terminal described in the claims correspond to, for example, the first electrode E1 and the second electrode E2 of the organic EL element 21, respectively. Moreover, according to the present exemplary embodiment, a fourth transistor described in the claims corresponds to, for example, the cathode voltage transistor Qo or the driving voltage transistor QDD.

According to the organic EL display 10 with the above-mentioned structure, when the driving voltage transistor QDD is in the electrical connection state (the on state) in accordance with the power source line control signals SCn, the driving voltage Vdd is supplied to the second electrode E2 of the organic EL element 21 through the electric potential control line Lo. Therefore, the second electrode E2 of the organic EL element 21 becomes an H state.

The driving voltage Vdd supplied to the second electrode E2 functions as an electric potential in which the organic EL element 21 does not emit light.

At this time, since driving voltage Vdd is supplied to the first electrode E1 of the organic EL element 21, current does not flow through the organic EL element 21. Therefore, the organic EL element 21 does not emit light.

Furthermore, when the cathode voltage transistor Qo becomes the electrical connection state (the on state) in accordance with the power source line control signals SCn, the cathode voltage Vo is supplied to the second electrode E2 of the organic EL element 21 through the electric potential control line Lo. A forward bias is supplied to the organic EL element 21 since the cathode voltage Vo is set to be smaller than the driving voltage Vdd. As a result, the driving current Ie1 received from the driving transistor Qd is supplied to the organic EL element 21. Therefore, the brightness of the organic EL element 21 is determined in accordance with the current level of the driving current Ie1.

Next, a method of driving the pixel circuits 20 of the organic EL display 10 with the above-mentioned structure will now be described with reference to FIG. 4. In FIG. 4, a driving period Tc is a period in which the brightness of the organic EL element 21 is updated once. The driving period Tc is the same as a frame period. T1 denotes a data-writing period. T2 denotes a light-emitting period. The driving period Tc includes the data-writing period T1 and the light-emitting period T2.

In the pixel circuit 20, The scanning signals SYn to switch the first and second switching transistors Qs1 and Qs2 to the on state for the writing period T1 are supplied from the scanning line driving circuit 13 through the scanning lines Yn. At this time, the power source line control signals SCn to switch the cathode voltage transistor Qo to the off state are supplied from the power source line control circuit 15 to the gate of the cathode voltage transistor Qo through the power source line control line F.

In this way, the first and second switching transistors Qs1 and Qs2 become the on state. Thus, the data current IdataM is supplied to the storage capacitor Co through the first switching transistor Qs1 and the second switching transistor Qs2. As a result, the voltage Vo corresponding to the quantity of charge in accordance with the current level of the data current IdataM is held in the storage capacitor Co. At this time, the variation in the characteristics of the driving transistor Qd, such as a threshold voltage and mobility, is compensated for since the driving transistor Qd is previously set to operate in a saturation region.

At this time, the power source line control signals SCn to switch the driving voltage transistor QDD to the on state are supplied from the power source line control circuit 15 to the control circuit TS, and then, the driving voltage transistor QDD becomes the on state. As a result, the driving voltage Vdd is supplied to the second electrode E2 of the organic EL element 21.

Therefore, since the electric potential of the second electrode E2 of the organic EL element 21 is equal to the driving voltage Vdd as illustrated in FIG. 4, the organic EL element 21 becomes a non-order bias state or a reverse bias state. As a result, the organic EL element 21 does not emit light.

The scanning signals SYn to switch the first switching transistor Qs1 and the second switching transistor Qs2 to the off state are supplied from the scanning line driving circuit 13 through the scanning lines Yn for the light-emitting period T2 after the data writing period T1. In this way, the first switching transistor Qs1 and the second switching transistor Qs2 become the off state.

At this time, the power source line control signals SCn to switch the cathode voltage transistor Qo to the on state are supplied from the power source line control circuit 15 to the control circuit TS. Therefore, the cathode voltage transistor Qo becomes the on state. As a result, the cathode voltage Vo is supplied to the second electrode E2 of the organic EL element 21, and thus the second electrode E2 of the organic EL element 21 becomes an L state.

That is, as illustrated in FIG. 4, since the electric potential of the second electrode E2 of the organic EL element 21 is the cathode voltage Vo and the electric potential of the second electrode E2 is lower than that of the first electrode E1, the forward bias is supplied to the organic EL element 21.

As a result, the driving current Ie1 corresponding to the voltage Vo held in the storage capacitor Co for the data-writing period T1 flows through the organic EL element 21. Therefore, the brightness gradation of the organic EL element 21 is precisely controlled in accordance with the data current IdataM.

As mentioned above, for the pixel circuit 20, it is possible to reduce the number of transistors provided therein by one as compared with the related art and to control the brightness gradation of the organic EL element 21 with high precision in accordance with the data current IdataM. Therefore, for the pixel circuit 20, it is possible to enhance an aperture ratio or yield in manufacturing the organic EL display 10.

According to the electronic circuit and the electro-optical device of the present exemplary embodiment, it is possible to obtain the following characteristics.

(1) According to the present exemplary embodiment, each of the pixel circuits 20 include the driving transistor Qd, the first switching transistor Qs1, the second switching transistor Qs2, the storage capacitor Co, and the organic EL element 21.

Each of the control circuits TS connected to the second electrode E2 of the organic EL element 21 through the electric potential line Lo and setting the electric potential of the second electrode E2 to the driving voltage Vdd or the cathode voltage Vo is provided in each of the plurality of pixel circuits 20.

In this way, for the pixel circuit 20, it is possible to reduce the number of transistors provided therein by one as compared with the related art pixel circuit while compensating for the variation in the threshold voltage or the mobility of the driving transistor Qd. As a result, for the pixel circuit 20 of the organic EL display 10, it is possible to enhance the yield or the aperture ratio in manufacturing the transistors in addition to controlling the brightness gradation of the organic EL element 21 with high precision.

Second Exemplary Embodiment

A second exemplary embodiment according to the present invention will now be described with reference to FIG. 5. In the present exemplary embodiment, the same members as those of the first exemplary embodiment are denoted by the same reference numerals, and the detailed description thereof will be omitted.

Figure 5:
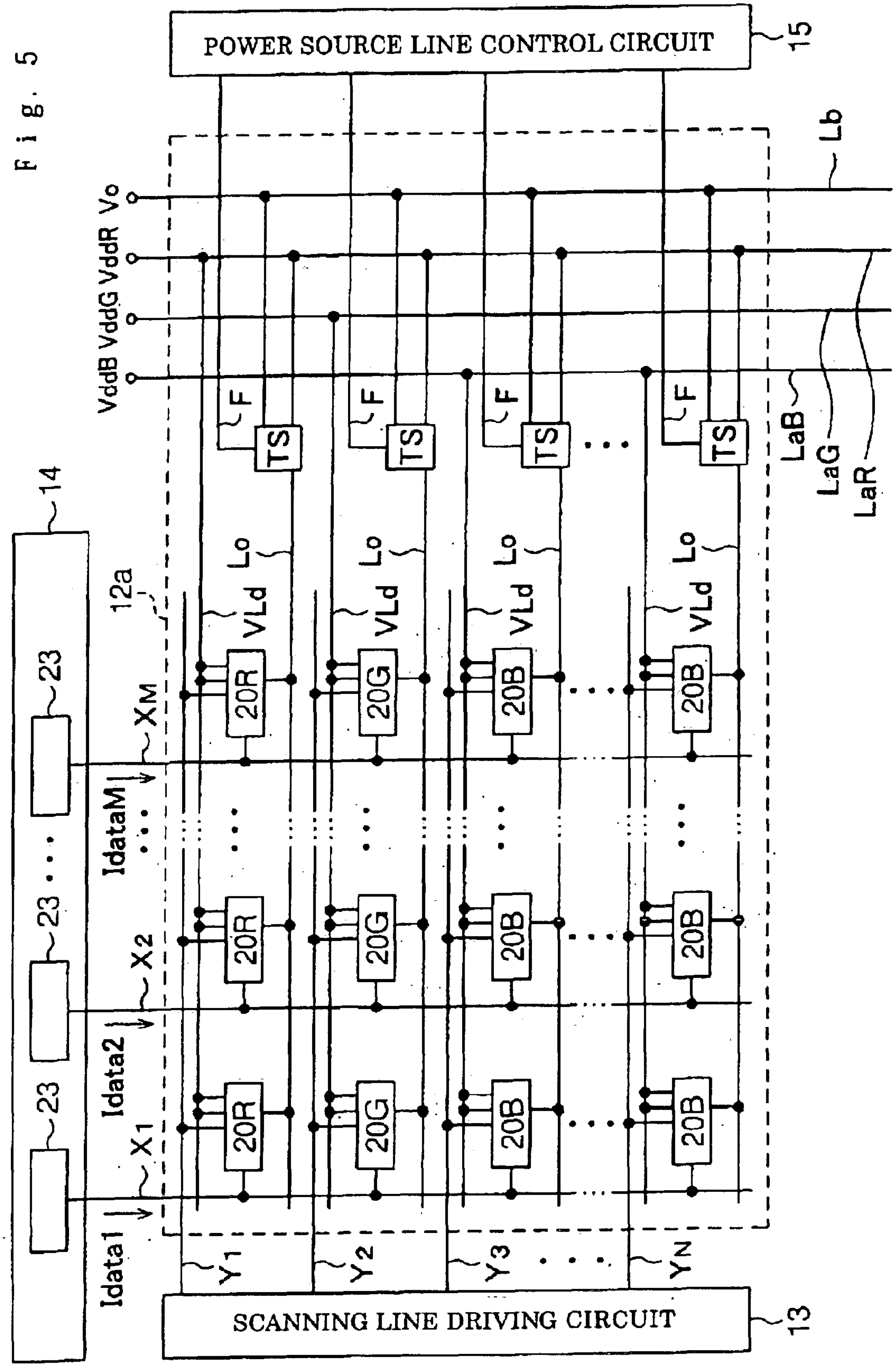
FIG. 5 is a circuitry block schematic illustrating internal structures of a display panel and a data line driving circuit according to a second exemplary embodiment of the present invention.

FIG. 5 is a circuitry block schematic illustrating internal structures of a display panel 12*a* and a data line driving circuit 14 of the organic EL display 10. According to the present exemplary embodiment, the display panel 12*a* includes pixel circuits for red 20R having organic EL elements 21 that emit red light, pixel circuits for green 20G having organic EL elements 21 that emit green light, and pixel circuits for blue 20B having organic EL elements 21 that emit blue light. The structures of the pixel circuits for red, green, and blue 20R, 20G, and 20B are the same as those of the pixel circuits 20 according to the first exemplary embodiment.

To be specific, in the display panel 12*a*, the pixel circuits for red, green, and blue 20R, 20G, and 20B are arranged along the direction of the scanning lines Yn. The driving transistor Qd and the storage capacitor Co constituting the pixel circuit for red 20R are connected to a first voltage supply line for red LaR to supply a driving voltage for red VddR through the power source line VLd. The driving transistor Qd and the storage capacitor Co constituting the pixel circuit for green 20G are connected to a first voltage supply line for green LaG to supply a driving voltage for green VddG through the power source line VLd. The driving transistor Qd and the storage capacitor Co constituting the pixel circuit for blue 20B are connected to a first voltage supply line for blue LaB to supply a driving voltage for blue VddB through the power source line VLd.

The driving voltages for red, green, and blue VddR, VddG, and VddB are the driving voltage of the driving transistor Qd constituting the pixel circuit for red 20R, the driving voltage of the driving transistor Qd constituting the pixel circuit for green 20G, and the driving voltage of the driving transistor Qd constituting the pixel circuit for blue 20B, respectively.

Next, a method of driving the pixel circuits 20R, 20G, and 20B of the organic EL display 10 with the above-mentioned structure will now be described.

First, a first scanning signal SY1 to switch the first and second switching transistors Qs1 and Qs2 of the pixel circuits for red 20R to the on state respectively is supplied from the scanning line driving circuit 13 through the first scanning line Y1. Furthermore, the power source line control signals SCn to switch the driving voltage transistors QDD to the on states are supplied from the power source line control circuit 15 through the electric potential control lines Lo.

As a result, in the pixel circuit for red 20R arranged in a direction where the first scanning line Y1 extends, the first and second switching transistors Qs1 and Qs2 connected to the first scanning line Y1 become the on state, respectively, and the electric potential of the second electrode E2 of the organic EL element for red 21 becomes the driving voltage Vdd.

In this state, the data current Idata is supplied from the data line Xm to the storage capacitor Co through the first switching transistor Qs1 and the second switching transistor Qs2. As a result, the voltage Vo corresponding to the quantity of charge in accordance with the current level of the data current IdataM is stored in the storage capacitor Co.

Subsequently, the first scanning signal SY1 to switch the first and second switching transistors Qs1 and Qs2 of the pixel circuit for red 20R to the off state respectively is supplied from the scanning line driving circuit 13 through the first scanning line Y1. Furthermore, the power source line control signal SCn to switch the cathode voltage transistor Qo to the on state is supplied from the power source line control circuit 15 through the electric potential control line Lo.

As a result, in the pixel circuit for red 20R, the first and second switching transistors Qs1 and Qs2 connected to the first scanning line Y1 become the off state, respectively, and the electric potential of the second electrode E2 of the organic EL element for red 21 becomes the cathode voltage Vo. Therefore, since the forward bias is supplied to the organic EL element for red 21, the driving current Iel is supplied to the organic EL element for red 21, and the organic EL element for red 21 emits light.

The second scanning signal SY2 to switch the first and second switching transistors Qs1 and Qs2 of the pixel circuit for green 20G to the on state is supplied from the scanning line driving circuit 13 through the second scanning line Y2. Furthermore, the power source line control signal SCn to switch the driving voltage transistor QDD to the on state is supplied from the power source line control circuit 15 through the electric potential control line Lo.

As a result, in the pixel circuit for green 20G arranged in a direction where the second scanning line Y2 extends, the first and second switching transistors Qs1 and Qs2 connected to the second scanning line Y2 become the on state, respectively, and the electric potential of the second electrode E2 of the organic EL element for green 21 becomes the driving voltage Vdd. The data current Idata is supplied from the data line Xm to the storage capacitor Co through the first switching transistor Qs1 and the second switching transistor Qs2. As a result, the voltage Vo corresponding to the quantity of charge in accordance with the current level of the data current IdataM is held in the storage capacitor Co.

Subsequently, the second scanning signal SY2 to switch the first and second switching transistors Qs1 and Qs2 of the pixel circuit for green 20G to the off state respectively is supplied from the scanning line driving circuit 13 through the second scanning line Y2. Furthermore, the power source line control signal SCn to switch the driving voltage transistor QDD to the on state is supplied from the power source line control circuit 15 through the electric potential control line Lo.

As a result, in the pixel circuit for green 20G, the first and second switching transistors Qs1 and Qs2 connected to the second scanning line Y2 become the off state, respectively, and the electric potential of the second electrode E2 of the organic EL element for green 21 becomes the cathode voltage Vo. Therefore, since the forward bias is supplied to the organic EL element for green 21, the driving current Ie1 is supplied to the organic EL element for green 21, and the organic EL element for green 21 emits light.

Furthermore, a third scanning signal SY3 to switch the first and second switching transistors Qs1 and Qs2 of the pixel circuit for blue 20B to the on state respectively is supplied from the scanning line driving circuit 13 through a third scanning line Y3. Moreover, The power source line control signal SCn to switch the cathode voltage transistor Qo to the on state is supplied from the power source line control circuit 15 through the electric potential control line Lo.

As a result, in the pixel circuit for blue 20B arranged in a direction where the third scanning line Y3 extends, the first and second switching transistors Qs1 and Qs2 connected to the third scanning line Y3 become the on state, and the electric potential of the second electrode E2 of the organic EL element for blue 21 becomes the driving voltage Vdd. In this state, the data current Idata is supplied from the data line Xm to the storage capacitor Co through the first switching transistor Qs1 and the second switching transistor Qs2. As a result, the voltage Vo corresponding to the quantity of charge in accordance with the current level of the data current IdataM is held in the storage capacitor Co.

Subsequently, the third scanning signal SY3 to switch the first and second switching transistors Qs1 and Qs2 of the pixel circuit for blue 20B to the off state is supplied from the scanning line driving circuit 13 through the third scanning line Y3. Furthermore, the power source line control signal SCn for switching the driving voltage transistor QDD to the on state is supplied from the power source line control circuit 15 through the electric potential control line Lo.

As a result, in the pixel circuit for blue 20G, the first and second switching transistors Qs1 and Qs2 connected to the third scanning line Y3 become the off state, and the electric potential of the second electrode E2 of the organic EL element for blue 21 becomes the cathode voltage Vo. Therefore, since the forward bias is supplied to the organic EL element for blue 21, the driving current Ie1 is supplied to the organic EL element for blue 21, and the organic EL element for blue 21 emits light.

Therefore, it is possible to obtain the same effect as that of the first exemplary embodiment from the organic EL display 10 of the second exemplary embodiment.

Third Exemplary Embodiment

Next, an exemplary embodiment in which the organic EL displays 10 as the electro-optical devices described in the first and second exemplary embodiments are applied to electronic apparatuses will be described with reference to FIG. 6. The organic EL display 10 can be applied to various electronic apparatuses, such as a mobile personal computer, a mobile telephone, and a digital camera.

Figure 6:
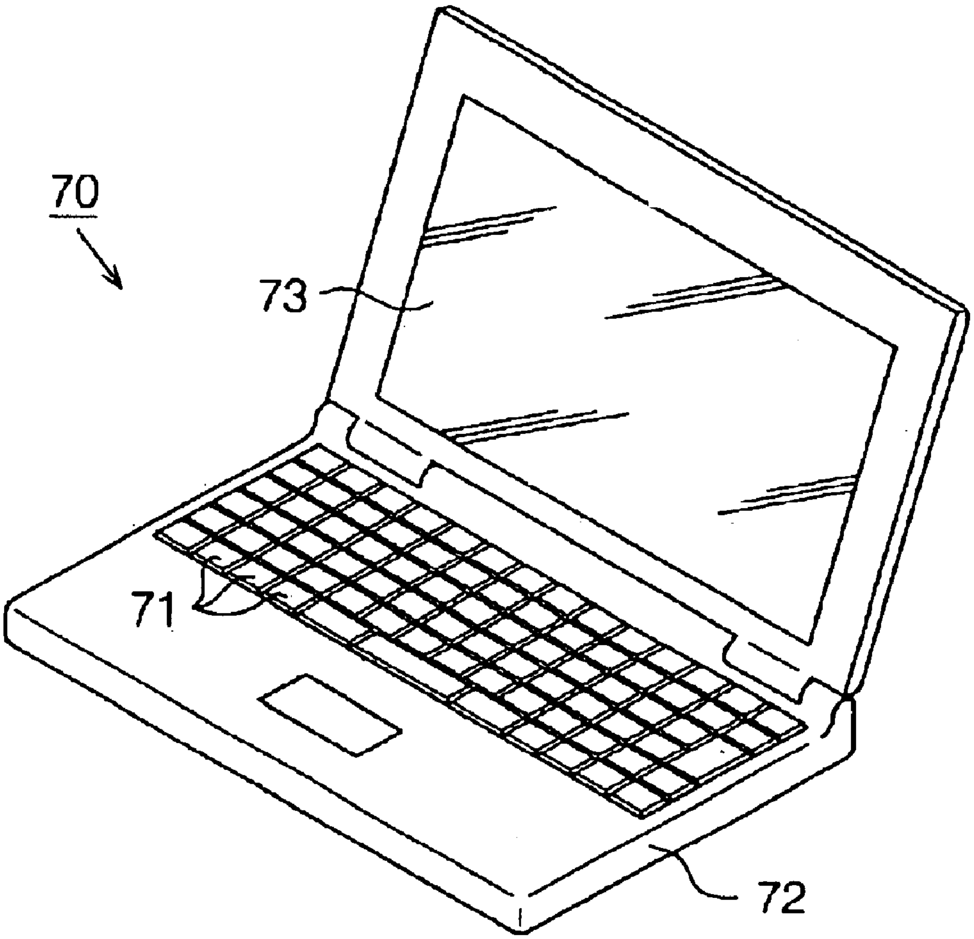
FIG. 6 is a perspective view illustrating a structure of a mobile personal computer for describing a third exemplary embodiment of the present invention.

FIG. 6 is a perspective view illustrating the structure of a mobile personal computer. In FIG. 6, a mobile personal computer 70 includes a main body 72 including a keyboard 71 and a display unit 73 using the organic EL display 10.

The display unit 73 using the organic EL display 10 provides the same effects as those of the first exemplary embodiment. As a result, it is possible to provide the mobile personal computer 70 including the organic EL display 10 capable of controlling the brightness gradation of the organic EL element 21 with high precision and of improving yield or an aperture ratio.

Furthermore, the exemplary embodiments of the present invention are not limited to the above embodiments.

For example, according to the above exemplary embodiments, the electric potential supplied to the second electrode E2 of the organic EL element 21 is the driving voltage Vdd so that the organic EL element 21 does not exhibit the optical effect thereof. However, the electric potential is not limited thereto and any electric potential, by which the organic EL element 21 does not exhibit the optical effect thereof, is preferable. The second electrode E2 may be a floating electrode.

According to the above exemplary embodiments, the plurality of power source lines VLd and the plurality of electric potential control lines Lo are connected to the first voltage supply line La. Alternatively, the plurality of first voltage supply lines La may be provided. The first voltage supply lines La are divided into the first voltage supply lines La connected to the plurality of power source lines VLd and the first voltage supply lines La connected to the plurality of electric potential control lines Lo. In this way, variation in the electric potential of the second electrode D2 of the storage capacitor Co due to the power source line control signal SCn is reduced. Therefore, it is possible to stably control the brightness of the organic EL element 21 in addition to the effects of the above-mentioned exemplary embodiments.

According to the above exemplary embodiments, one control circuit TS is shared by the plurality of pixel circuits 20 arranged along one scanning line Yn. Alternatively, one control circuit TS may be shared by the plurality of pixel circuits 20 arranged along one data line Xm (or a group of data lines). In this case, the data current Idata is supplied to the pixel circuits 20 arranged along the data line Xm in a state where the driving voltage transistor QDD constituting the control circuit TS is in the on state. Then, the organic EL elements 21 of the pixel circuits 20 simultaneously emit light by switching the cathode voltage transistor Qo constituting the control circuit TS to the on state.

The control circuit TS may be shared by the plurality of pixel circuits 20 arranged along the plurality of scanning lines.

In this way, it is possible to obtain the same effects as those of the above exemplary embodiments.

According to the above exemplary embodiments, the source of the driving voltage transistor QDD is connected to the first voltage supply line to supply the driving voltage Vdd. When the optical effect of the organic EL element 21 is not exhibited, the electric potential of the second electrode E2 of the organic EL element 21 is made equal to that of the first electrode E1 by supplying the driving voltage Vdd to the second electrode E2 of the organic EL element 21 through the first voltage supply line. As a result, the driving current Ie1 does not flow through the organic EL element 21.

Alternatively, the source of the driving voltage transistor QDD may be connected to the voltage supply line to supply a voltage no less than the driving voltage Vdd. When the optical effect of the organic EL element 21 does not exhibit, the electric potential of the second electrode E2 of the organic EL element 21 may be made larger than that of the first electrode E1 by supplying the voltage no less than the driving voltage Vdd to the second electrode E2 of the organic EL element 21 through the voltage supply line, and the driving current Ie1 does not flow through the organic EL element 21. Thus, it is possible to obtain the same effects as those of the above exemplary embodiments.

According to the above exemplary embodiments, the conductive type of the driving transistor Qd of the pixel circuit 20 is the p type (the p channel). Furthermore, the conductive types of the first switching transistor Qs1 and the second switching transistor Qs2 are set to the n type (the n channel). The drain of the driving transistor Qd is connected to the anode of the organic EL element, and the second electrode E2 of the organic EL element is connected to the electric potential control line Lo.

Alternatively, the conductive type of the driving transistor Qd may be set to the n type, and the conductive types of the first switching transistor Qs1 and the second switching transistor Qs2 may be set to the p type (the p channel).

In this case, the source of the driving transistor Qd arranged as mentioned above may be connected to the cathode of the organic EL element, and the anode of the organic EL element may be connected to the electric potential control line Lo. It is possible to apply the pixel circuit 20 to the pixel circuit of an electro-optical device of a top emission method by constituting the pixel circuit 20 as mentioned above.

According to the above exemplary embodiments, the gate of the first switching transistor Qs1 is connected to the gate of the second switching transistor Qs2 and to the scanning line Yn. Alternatively, the gate of the first switching transistor Qs1 and the gate of the second switching transistor Qs2 may be separately connected to scanning lines.

According to the above exemplary embodiments, the control circuit Ts includes the driving voltage transistor QDD and the cathode voltage transistor Qo. Alternatively, the control circuit TS may include a switch capable of switching between a low electric potential and a high electric potential instead of the driving voltage transistor QDD and the cathode voltage transistor Qo.

Furthermore, a buffer circuit or a voltage follower circuit including a source follower circuit may be used in order to enhance the driving ability of the driving voltage transistor QDD and the cathode voltage transistor Qo. According to such constitution, it is possible to obtain the same effects as those of the above exemplary embodiments.

According to the above exemplary embodiments, the non-order bias or the reverse bias is applied to the organic EL element 21, which is an electronic element, during the writing of data. However, for example, it is possible to set a period to apply the non-order bias or the reverse bias in addition to the period to write data in order to lengthen the life of the organic EL element 21.

According to the above exemplary embodiments, the first and second voltage supply lines La and Lb are provided at the right end of the display panel 12, but not necessarily. The first and second voltage supply lines La and Lb may be provided at the left end of the display panel 12. In this way, it is possible to obtain the same effects as those of the above exemplary embodiments.

According to the above exemplary embodiments, appropriate effects are obtained by applying the present invention to the pixel circuit 20 as the unit circuit. However, the present invention may be applied to a unit circuit to drive an electro-optical element, such as a LED or a FED other than the organic EL element 21. Furthermore, the present invention may be applied to a memory device, such as a RAM (in particular, a MRAM).

According to the above exemplary embodiments, the present invention is applied to the organic EL element 21 as a current-driven element of the pixel circuit 20. However, the present invention may be applied to an inorganic EL element. That is, the present invention may be applied to an inorganic EL display formed of an inorganic EL element.

What is claimed is:

1. An electronic device comprising:

a plurality of first signal lines;

a plurality of second signal lines;

a plurality of power source lines, the plurality of power source lines extending along a direction in which the plurality of first signal lines extend; and a plurality of unit circuits, each of the plurality of unit circuits including a first transistor, a conduction state of the first transistor being set by a data current that flows between one power source line of the plurality of power source lines and one second signal line of the plurality second signal lines, and the data current flowing between the one power source line and the one second signal line during a first period.

2. The electronic device according to claim 1, the data current flowing through the first transistor during the first period.

3. The electronic device according to claim 1, each of the plurality of unit circuits further including a second transistor, the first transistor including a first terminal, a second terminal, and a first control terminal, the second transistor including a third terminal, a fourth terminal, and a second control terminal, and the data current flowing through the first transistor and the second transistor.

4. The electronic device according to claim 1, each of the plurality of unit circuits further including a second transistor, a third transistor, and an electronic element, the first transistor including a first terminal, a second terminal, and a first control terminal, the second transistor including a third terminal, a fourth terminal, and a second control terminal, the electronic element including a fifth terminal and a sixth terminal, the fifth terminal being coupled to the first terminal, the sixth terminal being set to a plurality of electronic potentials or to be electrically connected to a predetermined electric potential and electrically disconnected from the predetermined electric potential.

5. The electronic device according to claim 1, the data current not flowing through the electronic element during the first period.

6. The electronic device according to claim 1, further comprising a control circuit, each of the plurality of unit circuits further including a second transistor, a third transistor, and an electronic element, the first transistor including a first terminal, a second terminal, and a first control terminal, the second transistor including a third terminal, a fourth terminal, and a second control terminal, the electronic element including a fifth terminal and a sixth terminal, the fifth terminal being coupled to the first terminal, the sixth terminal being coupled to an electric potential control line, the third transistor to control electrical connection between the first terminal and the first control terminal, and the control circuit setting the electrical potential line to a plurality of electric potentials, or the control circuit controlling electrical connection and electrical disconnection between the electric potential control line and a predetermined electric potential.

7. The electronic device according to claim 3, each of the plurality of unit circuits further including a third transistor that controls electrical connection between the first terminal and the first control terminal, transistors included in each of the plurality of unit circuits being only the first transistor, the second transistor and the third transistor.

8. The electronic device according to claim 1, each of the plurality of unit circuits further including an electronic element that is coupled to the first transistor, and the electronic element being a current driven element.

9. The electronic device according to claim 3, each of the plurality of unit circuits further including a capacitive element that is coupled to the first control terminal.

10. The electronic device according to claim 6, the control circuit being a fourth transistor including a ninth terminal and a tenth terminal, the ninth terminal being coupled to the sixth terminal through the electric potential control line, and the tenth terminal being coupled to a supply line to supply the plurality of electric potentials or the predetermined potential.

11. The electronic device according to claim 1, further comprising a plurality of electro-optical elements, the plurality of first signal lines being a plurality of scanning lines, the plurality of second signal lines being a plurality of data lines, and a gray scale level of each of the plurality of electro-optical elements being determined according to the conduction state of the first transistor.

12. The electronic device according to claim 11, the electro-optical element being an EL element.

13. The electronic device according to claim 11, the plurality of electro-optical elements including a plurality of groups each of which includes electro-optical elements whose color is same and that are disposed along one scanning line of the plurality of scanning lines.

14. An electronic apparatus comprising the electronic device according to claim 1.

15. A method of driving an electronic device including a plurality of first signal lines, and a plurality of power source lines, a group of unit circuits that are disposed along one first signal line of the plurality first signal lines and one power source line of the plurality of power source lines, the group of unit circuits including first transistors and second transistors, the method comprising:

supplying a first signal that puts the second transistors into on-states during at least a part of a first period; and supplying data currents that flow through the second transistors and the first transistors between the one power source line and a plurality of second signal lines during at least a part of the first period, a conduction state of each of the first transistors being set by a data current of the data currents.

16. The method according to claim 15, the plurality of second signal lines intersect the one first signal line and the one power source lines.

17. The method according to claim 15, further comprising supplying at least one of a driving current and a driving voltage to an electronic element that is formed for each of the first transistors, at least one of a current level of the driving current and a voltage level of the driving voltage being determined by the conduction state of the first transistor.

18. The method according to claim 17, the electronic element being an electro-optical element, and a gray scale level of the electro-optical element being determined by the conduction state of the first transistor.

19. The method according to claim 15, each of the plurality of unit circuits including a third transistor that controls an electrical connection and an electrical disconnection between a first terminal and a first control terminal, and the first terminal and the first control terminal being included in a first transistor of the first transistors.

20. The method according to claim 19, further comprising putting the third transistor an on-state so as to electrically connect the first terminal to the first control terminal during at least a part of the first period.

21. The method according to claim 17, no current being supplied to the electronic element during at least a part of the first period.

* * * * *